United States Patent
Hui

(10) Patent No.: US 6,400,178 B1
(45) Date of Patent: *Jun. 4, 2002

(54) CMOS SMALL SIGNAL TERMINATED RECEIVER

(75) Inventor: David T. Hui, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/580,289

(22) Filed: May 30, 2000

(51) Int. Cl.[7] .................. H03K 17/16; H03K 19/003
(52) U.S. Cl. .................... 326/30; 326/26; 326/27; 326/83; 326/86
(58) Field of Search .................... 326/83, 86, 26, 326/27, 30

(56) References Cited

U.S. PATENT DOCUMENTS

| | | | |
|---|---|---|---|
| 4,228,369 A | 10/1980 | Anantha et al. | 307/270 |
| 4,525,830 A | 7/1985 | Cohen et al. | 370/60 |
| 4,748,426 A | 5/1988 | Stewart | 333/22 R |
| 4,989,202 A | 1/1991 | Soto et al. | 370/13 |
| 5,204,860 A | 4/1993 | Sparks | 370/110.1 |
| 5,387,131 A | 2/1995 | Foreman et al. | 439/620 |
| 5,493,657 A | 2/1996 | Van Brunt et al. | 395/308 |
| 5,523,704 A | 6/1996 | So | 326/30 |
| 5,675,580 A | 10/1997 | Lyon et al. | 370/250 |
| 5,729,824 A | 3/1998 | O'Neill et al. | 455/3.1 |
| 5,760,601 A * | 6/1998 | Frankeny | 326/30 |
| 5,850,387 A | 12/1998 | Lyon et al. | 370/250 |
| 5,917,827 A | 6/1999 | Cantwell | 370/466 |
| 5,977,797 A | 11/1999 | Gasparik | 326/86 |
| 6,008,665 A * | 12/1999 | Kalb et al. | 326/30 |
| 6,037,805 A * | 3/2000 | Kuroda et al. | 326/101 |
| 6,100,713 A * | 8/2000 | Kalb et al. | 326/30 |
| 6,262,591 B1 * | 7/2001 | Hui | 326/30 |

* cited by examiner

Primary Examiner—Michael Tokar
Assistant Examiner—Steven S. Paik
(74) Attorney, Agent, or Firm—Lynn L. Augspurger

(57) ABSTRACT

A terminator circuit for connection to a network can be fabricated and used within CMOS-SOI (complementary metal oxide semiconductor—silicon on insulator) for carrying small logic level signals for connecting data from a network's first circuit to a network's second circuit in which a network's input terminal connects a terminator circuit to the network's second circuit to act as a terminator on the data line passing data from the first circuit to the second circuit. The terminator circuit has a reference circuit coupled to a terminal circuit and to a differential hysteresis receiver. The reference circuit has devices back to back source coupled devices to each other for a tuned center reference voltage node. An upper level power source is connected to one side of the reference voltage node and a lower reference voltage power source is connected to the other side of the reference voltage node. The voltage level above the common tuned reference voltage and a lower level voltage is supplied to the terminator's corresponding input terminal circuit control nfet and pfet mirror devices also connected respectively to lower and upper level supply power to control each of their turn on voltages. Resistors of the reference path establish the swing voltage of the terminator as being that approximating an ideal 50 ohm split resistor terminator. The tuned voltage levels supplied to the terminator input circuit for the termination to the network as a terminator on the data line passing data from said first circuit to said second circuit supplying, and also, supplied to the hysteresis differential receiver which is integrated into the terminator circuit to set up a threshold tuned reference voltage between the logic levels of said terminator input circuit for the network.

11 Claims, 5 Drawing Sheets

CMOS SMALL SIGNAL TERMINATED RECEIVER

FIELD OF THE INVENTION

This invention relates to terminators which are applicable to complementary metal oxide semiconductor (CMOS) with triple wells integrated circuit technology and which are particularly useful for terminator networks.

RELATED APPLICATIONS

This application is related to the following concurrently filed application (s):

U.S. Ser. No. 09/580,290, filed May 30, 2000, entitled: CMOS Small Signal Terminator and Network, naming David T. Hui, inventor; and U.S. Ser. No. 09/593,187, filed May 30, 2000, entitled: SOI Small Signal Terminator and Network, naming David T. Hui, inventor; and U.S. Ser. No. 09/583,185, filed May 30, 2000, entitled: Method for use with a Terminator and Network, naming David T. Hui, inventor; and U.S. Ser. No. 09/580,942, filed May 30, 2000, entitled: SOI Small Signal Switchable Adjustable Terminated Hysteresis Receiver, naming David T. Hui, inventor; and U.S. Ser. No. 09/583,055, filed May 30, 2000, entitled: CMOS Small Signal Switchable Terminator Network, naming David T. Hui, inventor; and U.S. Ser. No. 09/583,186, filed May 30, 2000, entitled: CMOS Small Signal Switchable Adjustable Impedence Terminator Network, naming David T. Hui, inventor; and U.S. Ser. No. 09/580,789, filed May 30, 2000, entitled: CMOS Small Signal Switchable and Adjustable Terminator Network, naming David T. Hui, inventor; and U.S. Ser. No. 09/583,188, filed May 30, 2000, entitled: CMOS Small Signal Switchable Impedance and Voltage Adjustable Terminator Network, naming David T. Hui, inventor; and U.S. Ser. No. 09/580,805, filed May 30, 2000, entitled: CMOS Small Signal Switchable Impedance and Voltage Adjustable Terminator Network and Receiver Integration, naming David T. Hui, inventor; and U.S. Ser. No. 09/580,680, filed May 30, 2000, entitled: CMOS Small Signal Switchable Impedance and Voltage Adjustable Terminator with Hysteresis Receiver Network, naming David T. Hui, inventor; And U.S. Ser. No. 09/580,802, filed May 30, 2000, entitled: CMOS Small Signal Terminated Hysteresis Receiver, naming David T. Hui, inventor; and U.S. Ser. No. 09/580,943, filed May 30, 2000, entitled: SOI Small Signal Terminated Receiver, naming David T. Hui, inventor.

This related application(s) and the present application are owned by one and the same assignee, International Business Machines Corporation of Armonk, N.Y.

The descriptions set forth in these co-pending applications are hereby incorporated into the present application by this reference.

TRADEMARKS

S/390 and IBM are registered trademarks of International Business Machines Corporation, Armonk, N.Y., U.S.A. Other names may be registered trademarks or product names of International Business Machines Corporation or other companies.

BACKGROUND

For signal interfaces between devices terminators have been used, as described for instance in U.S. Pat. No. 4,748,426: entitled "Active termination circuit for computer interface use", granted May 31, 1998 to Alexander Stewart for Rodime PLC, in an active termination circuit for a computer interface for reducing line reflection of logic signals. Such terminators have used a first and second resistor combination to permanently connect to a signal line that couples a plurality of peripheral devices to one another. The other ends of the first and second resistors are connected through a switching device to a positive voltage supply line and to logic ground, respectively. When termination of multiple devices was required, a plurality of resistor combinations were provided but on/off control of the switch in this example was achieved by one control that is located remote from the termination circuit systems. Integrated circuit interconnection structures have also used precision terminating resistors, as illustrated by U.S. Pat. No. 4,228,369, granted in October, 1980 to Anantha et al. for IBM.

As will be illustrated for chip interconnection, when resistor terminators are used in thin film semiconductor integrated circuits such as those used in metal oxide semiconductors (e.g. CMOS) today, they create hot spots which cannot be adequately cooled, so such resistor terminator circuits which create hot spots cannot be used in metal oxide semiconductor applications to provide terminators for chip to chip connections on chips using IBM's new sub-micron MOS (CMOS) technologies where because of the high currents used in these networks it is difficult or impossible to meet all the cooling and reliability requirements required for commercial performance. It has become necessary to invent a solution to interfacing devices which can be used in such environments on chips, and used for terminators in networks of chips and devices where there is a need to transmit digital data therebetween without overshoot and undershoot in signal transmission between the chips and devices or systems. These connections need to operate at a faster speed, accommodating data rate speeds ranging into hundreds of Mhz and Ghz.

The creation of a terminator which particularly may be fabricated for high speed metal oxide semiconductor (MOS) applications in integrated circuits is needed.

This invention relates to an integrated term receiver network which is useful for fast transmission of dig data, eliminating or reducing overshoot and undershoot in signal transmission between chips and between systems, in serial links and data buses, for minimizing ringing and similar noise problems, for providing electrostatic discharge (ESD) protection, particularly in high speed metal oxide semiconductor (MOS) integrated circuit applications, and mixed vender technology interface communications. The demand for fast data transmission has pushed the data rate into hundreds of Mhz and Ghz. Therefore it is advantages to reduce the signal swing so that the signal reach its desired digital ones or zeros voltage levels faster with lower power and with less noise generation.

Also, a conventional CMOS receiver does not have good control on its threshold voltage to deal with small signals.

SUMMARY OF THE INVENTION

The current preferred embodiment provides a CMOS small signal terminated receiver network which allows setting up a well balanced threshold voltage between the upper and lower logic levels, so that maximum noise tolerance between logic levels can be achieved for a receiver in a terminated receiver network. The terminator network is adapted for MOS and can match the characteristic impedance of the line.

The preferred terminator network is fast and suitable for small signal swings and may also be used in a mixed technologies communication.

It provides a terminator and receiver network which has low current flow and low power consumption.

The receiver that can receive small signals properly and have balanced noise tolerance between both upper and lower logic levels.

The preferred embodiment of the invention provides a terminator network that provides ESD protection at the input of an attached circuit.

These and other improvements are set forth in the following detailed description. For a better understanding of the invention with advantages and features, refer to the description and to the drawings.

The detailed description explains the preferred embodiments of my invention, together with advantages and features, by way of example with reference to the drawings.

DETAILED DESCRIPTION OF THE INVENTION

Figure 1:
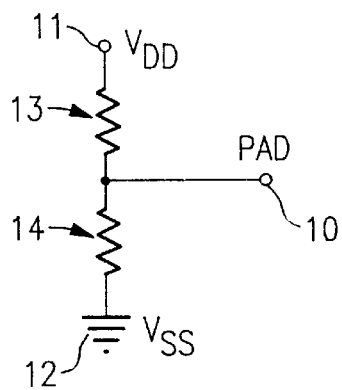
FIG. 1 illustrates the prior art Resistor Terminator Network.

Resistor terminators were used in prior art as shown in FIG. 1. Where resistor 13 is connected to node 11 to the upper power supply VDD and the other end of resistor 13 is connected to the node 10 and is also connected in series to resistor 14. The other end of resistor 14 is then connected to node 12 to the lower power supply VSS. The value of the resistors are set so that node 10 has a bias voltage equal to the center of the in coming signal swing and the parallel combination of the resistors matches the characteristic impedance Z0 of the transmission line that it is connected to, so that no reflections will occur and a clean signal can be obtain. However, these resistor terminators can't be used in needed high speed chips and their interconnections because of the significant power that is dissipated in them. Also, any construction of these resistor terminators on a chip using the new sub-micron MOS technologies would be difficult because of the high currents in this network as there would be a failure in meeting all the cooling and reliability requirements.

In describing the preferred embodiment of the present invention, reference will be made herein to FIGS. 2 to FIG. 7 of the drawings.

Figure 2:
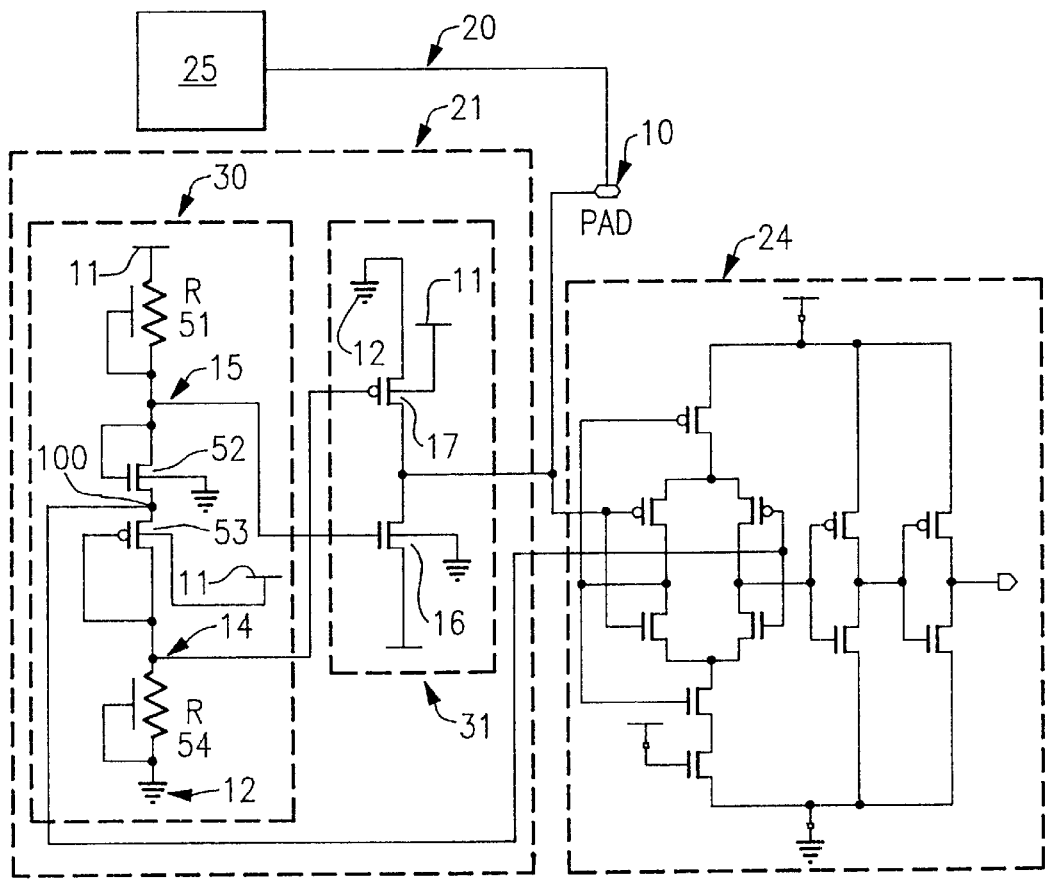
FIG. 2 illustrates the present invention CMOS small signal terminated receiver network.

FIG. 2 shows a network 20 carrying signals from a first circuit 25 to a second circuit 24. An input terminal 10 connects the terminator circuit 21 to the input circuit 24. The first circuit 25 may be operating at a different voltages then the second circuit 24. Generally, the terminating circuit 21 and the second circuit 24 will be constructed very close together physically in the same electronic system. In this invention, Circuit 21 and circuit 24 are integrated together so that it will be most efficient. The first circuit 25 communicating over net 20 may be remotely located in the same electronic system or even external to the electronic system in which the terminating circuit and the second circuit 24 are located. It is preferred that the electronic systems in which the circuits 21, 25 and 24 are located are digital systems as computer systems, and the network 20 may be connecting different components such as different processor or memory buses or data links or may be connecting different electronic components between two computer systems or other electronic systems which need to communicate data, digitized electrical signals or electrical signals.

In the terminator circuit 21 illustrated in FIG. 2 is comprised of a reference circuit 30 and an input circuit 31. The reference circuit 30 generates two reference voltages on node 14 and node 15. These two voltages can be produce independently on separate paths or a single path with series connected devices as shown in FIG. 2 as a prefer embodiment. This reference path is comprised of a series connected resistor 51 from the upper power supply 11 to node 15, and from node 15 it is connected to the gate and drain of nfet 52 the source of nfet 52 is connected to node 100, node 100 is then connected to the source of pfet 53, the gate of pfet 53 is tie to its drain and both connected to node 14, and from node 14 connected resistor 54 and the other end of resistor 54 is connected to the lower power supply 12 or ground in this case.

It will be recognized that importantly node 100 is tuned to a voltage level equal to the center of the incoming voltage swing between the logic '1' and '0' voltage levels of a reference circuit, from herein this center voltage will be call Vcenter. This Vcenter is then connected to one input of the differential receiver circuit 24, so that the differential receiver in circuit 24 will now have a stable and well centered threshold voltage.

The other input of the differential receiver will be connected to the input terminal or PAD. Circuit 24 can be any differential receiver that is tuned to operate with the common mode voltage equal to Vcenter and have the speed requirements for the transmission system.

Circuit 24 is an example of such operative differential receiver. This Vcenter will also set node 15 at a voltage which is a vt above the Vcenter and node 14 at a voltage which is a vt below Vcenter. Node 15 is also connected to the gate of nfet 16. Node 14 is also connected to the gate of pfet 17. The sources of nfet 16 and pfet 17 are tie together to the input terminal 10 or PAD, then it is connected to net 20, where it then connects to the driving circuit 25 as stated in the beginning. The operation of this invention is as follows. When the terminal 10 is driven to rise above the Vcenter, The gate to source voltage in pfet 17 is driven to below vt and more, and it starts to turn-on and conduct current to lower level power 12 or ground, whereas gate to source of nfet 16 is below vt and therefore has no conduction, no current will flow in nfet 16 to upper level power 11 or VDD. On the other hand when terminal 10 falls below Vcenter, the gate to source voltage of nfet 16 is above vt and turns-on to conduct current to upper level power 11 or power supply VDD. Now the pfet 17 is off, since the gate to source voltage is above vt. In this preferred embodiment a back to back gate to drain connected configuration of nfet 52 and pfet 53 is provided in the reference circuit, and this tracks to its corresponding mirror like devices nfet 16 and pfet 17, and therefore controls each of their turn on voltages and so no excessive through current in nfet 16 and pfet 17 will occur. Since at its logic state one of the devices 16 and 17 will be off, and therefore achieve the claim of low power. Further more, it also generates the center voltage between logic "1" and "0" which is then feed into one of the differential receiver inputs so that the receiver threshold voltage is always correct and tracks with the terminator.

Therefore it is best suited for a the small signal input operation.

The results of the small signal terminated receiver network as constructed according to the present invention are shown in the following figures. The center of the input voltage swing is at vdd/2 for this illustration. Other input voltage swing can be design as well by changing the resistors.

Figure 3:
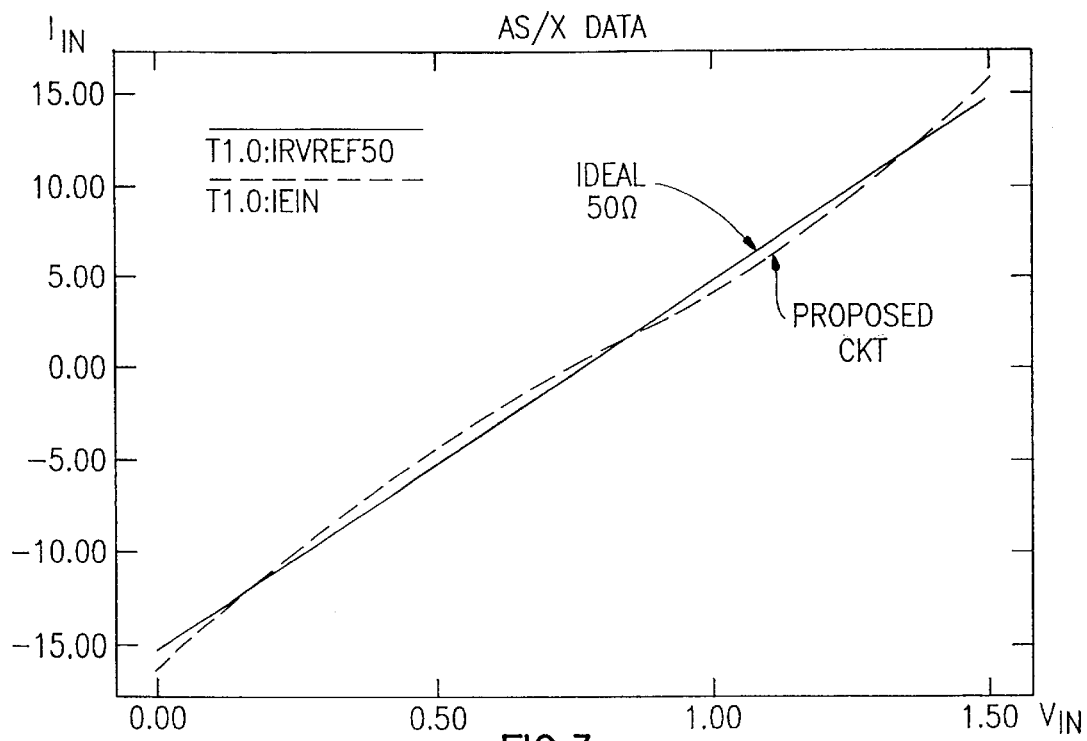
FIG. 3 is a graph having two curves depicting input currents as a function of the input voltages for the CMOS small signal terminator network constructed according to the present invention and a ideal 50 ohm terminator.

FIG. 3 is a graph having two curves depicting input currents as a function of the input voltages for the CMOS small signal terminator network constructed according to the present invention and a ideal 50 ohm split resistor terminator. As shown the impedance of the present invention can be match very closely to the ideal resistor terminator.

Figure 4:
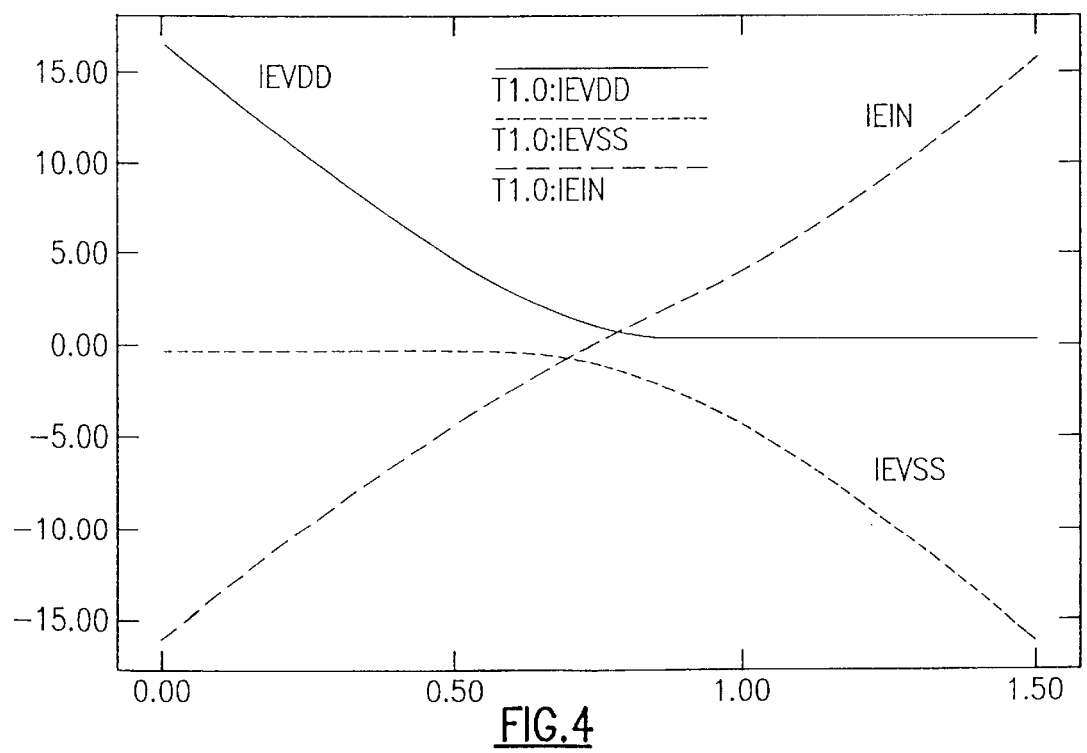
FIG. 4 is a graph having curves depicting the input current as a function of the input voltages for the CMOS small signal terminator constructed according to the present invention and curves of the upper and lower power supply currents as a function of the input voltage.

FIG. 4 is a graph having curves depicting the input current as a function of the input voltages for the CMOS small signal terminator constructed according to the present invention and curves of the upper and lower power supply currents as a function of the input voltage. The input current at the upper half cycle of the input voltage is directed to flow into the lower power supply, and current of the lower half cycle are directed to flow out from the upper power supply. Other than the bias current, there are no through current from the upper to the lower power supplies.

Figure 5:
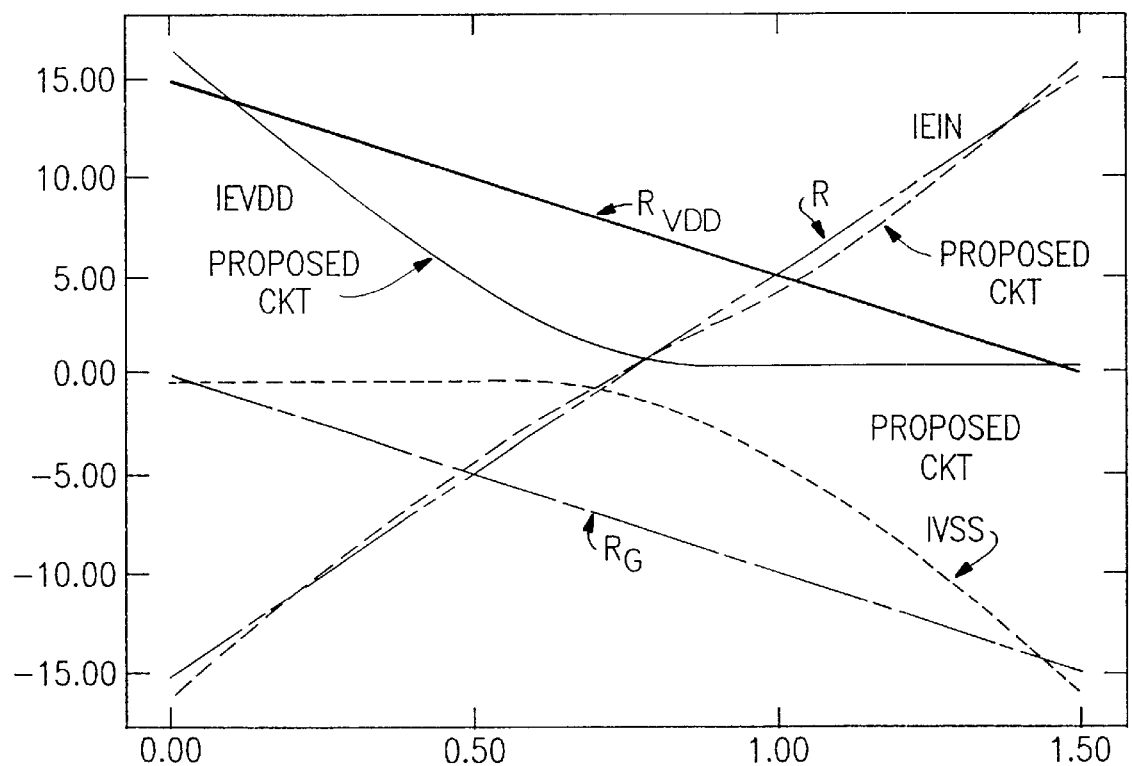
FIG. 5 is a graph having curves depicting the input current as a function of the input voltages for the CMOS small signal terminator constructed according to the present invention and curves of its currents to the upper and lower power supplies as a function of the input voltages. Also having curves of the corresponding input current, and the currents to the upper and lower power supplies for an split resistor terminator as in the prior art.

FIG. 5 is a graph having curves depicting the input current as a function of the input voltages for the CMOS small signal terminator constructed according to the present invention and curves of its currents to the upper and lower power supplies as a function of the input voltages. Also the graph has curves of the corresponding input current, and the currents to the upper and lower power supplies for an split resistor terminator as in the prior art. This shows the large difference in the power supply currents at and near the center of the swing between the prior art and the present invention.

Figure 6:
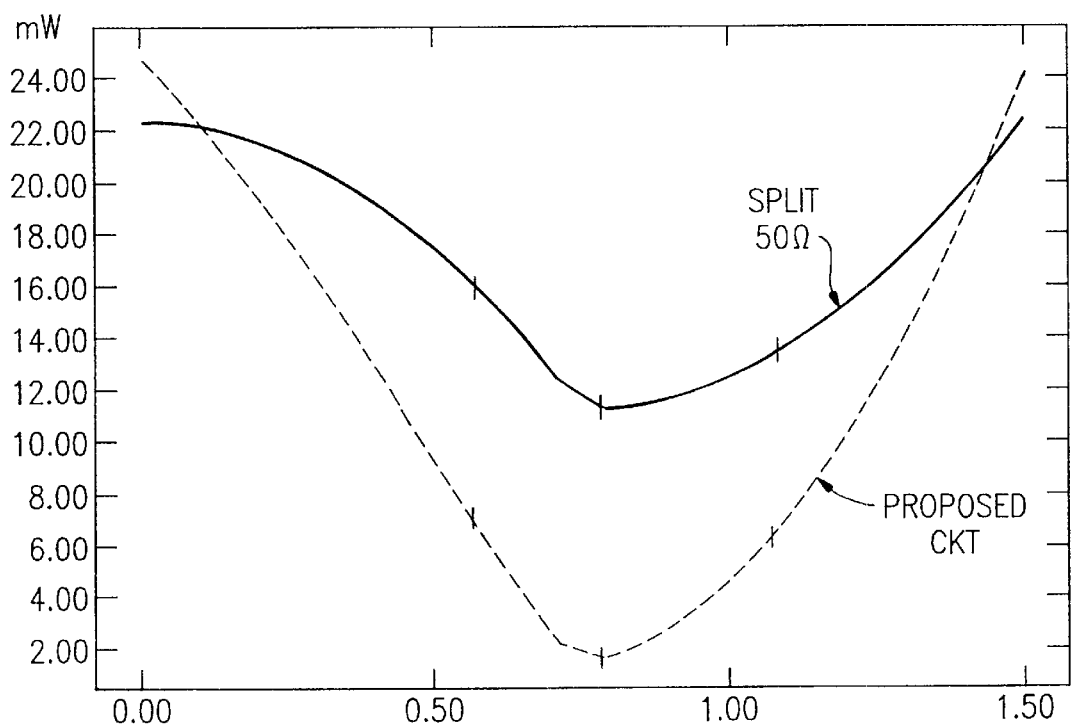
FIG. 6 is a graph having curves of the power consumption as a function of input voltages for the CMOS small signal terminator constructed according to the present invention and the power consumption of a split resistor as in prior art.

FIG. 6 is a graph having curves of the power consumption as a function of input voltages for the CMOS small signal terminator constructed according to the present invention and the power consumption of a split resistor as in prior art. This shows the power which the prior art consumes is a lot more then the present invention in small signal applications.

Figure 7:
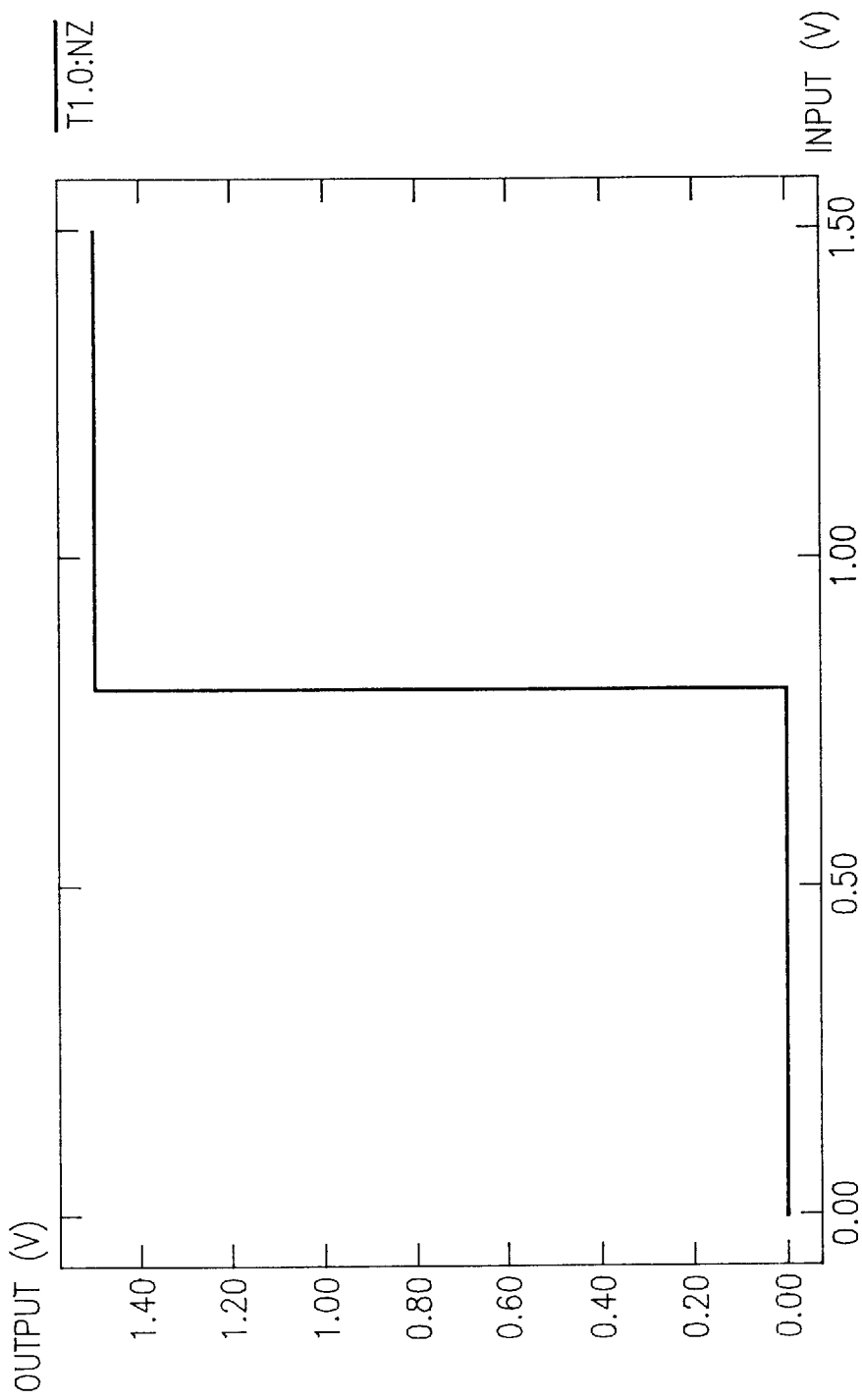
FIG. 7 is a graph with a curves showing the output voltage as a function of input voltages for the CMOS small signal terminated receiver constructed according to the present invention.

FIG. 7 has a curve showing the output voltage as a function of input voltages switching at the Vcenter for the CMOS small signal terminated receiver constructed according to the present invention. In terms of ESD protection. When the circuit described in the present invention is powered up. It has a low resistance path to one of the power supplies depending on the input voltage level. If the input terminal voltage moves more then about 0.7 volts outside the upper or lower power supplies, the parasitic diodes and the parasitic bipolar transistor in the pfet 17 and nfet 16 also turn on to further reduce the input impedance, hence improving the performance of the ESD protection. This performance is so effective that an additional ESD protection device may not be necessary to protect this circuit or the input/output circuit connected to this terminal there after. The parasitic elements in pfet 17 and nfet 16 are active even when the devices are not powered which provides significant ESD protection during handing of the device. The implementation shown results in a clean signal on network 20 with no or minimum reflection and noise generated in the system and a fast, solid, clean and reliable small swing can be obtain for a point to point nets as well as a cleaner multiple drop net. This implementation provide the fastest transmission of data and signals with much lower power consumption as compared to split resistor termination networks. The combination of the small signal terminating network and receiver, providing both the termination to the net as well as the center voltage to the differential receiver is a perfect marriage to do the small signal operation.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A CMOS terminator circuit for connection to a network carrying small logic level signals from a network's first circuit to a network's second circuit in which a network's input terminal connects a terminator circuit to the network's second circuit to act as a terminator on the data line passing data from said first circuit to said second circuit, comprising:

a terminator circuit (21) including a terminator reference circuit (30) generating logic '1' and logic '0' reference voltage levels and being coupled to a terminator input circuit (31) in said terminator circuit having a first and a second control device, and wherein said terminator circuit is coupled to a differential receiver (24), said terminator input circuit being coupled to said network input terminal (10) for connecting the network's first circuit to the network's second circuit, said reference circuit being tuned to a voltage level equal to the center of the incoming voltage swing between said logic '1' and '0' voltage levels of said reference circuit and coupled to one input of said differential receiver circuit (24) to provide to said differential receiver circuit a stable and well centered threshold voltage, said differential receiver having another differential receiver input which is coupled to the network input terminal for connecting the network's first circuit to the network's second circuit.

2. The CMOS terminator circuit according to claim 1 wherein when the terminal (10) is driven to rise above the center of said tuned reference voltage, the gate to source voltage in an input circuit (31) first control device (pfet 17) is driven to a lower voltage, and said input circuit first control device starts to turn-on and conduct current to a lower level power supply (12 or ground), whereas when a second control device has no conduction, no current will flow to a upper level power supply, but when terminal (10)

falls below center of said tuned reference voltage said second control device turns on to conduct current to said upper level power supply, while said first control device is off.

3. The CMOS terminator circuit according to claim 2 wherein said reference circuit tracks said first and second control devices of said input circuit, and controls each of their turn on voltages and so no excessive through current will occur.

4. The CMOS terminator circuit according to claim 3 wherein said reference circuit which tracks said first and second control devices of said input circuit also generates said center of said tuned reference between logic "1" and "0" which is then feed into one of the differential receiver inputs so that the receiver threshold voltage is always correct and tracks with the terminator input circuit for a the small signal input operation to set up a threshold tuned reference voltage between the logic levels of said terminator input circuit for said network.

5. The CMOS terminator circuit for connection to a network according to claim 4, wherein said tuned reference voltage is tuned to a voltage level equal to the center of an incoming voltage swing between the logic '1' and '0' voltage levels between an upper level power supply and a lower level power supply, and the tuned reference voltage levels are set by said terminator reference circuit and mirrored into said differential receiver.

6. The CMOS terminator circuit for connection to a network according to claim 5 wherein said two reference voltage levels between an upper level power supply and a lower level power supply are supplied by a single reference path of said reference circuit which comprises an upper level power supply (11) which is coupled to a second node (15), and from said second node (15) said voltage reference path is connected to the gate and drain of a reference circuit nfet (52) device, and the source of said reference circuit nfet (52) device is connected to a tuned reference voltage node for said center of the reference voltage which is then connected to the source of a reference circuit pfet (53) device, and wherein the gate of the reference circuit pfet (53) device is tied to its drain and both the source and gate of the reference circuit pfet (53) device are connected to the first node (14) which is connected to the lower level power supply (12).

7. The CMOS terminator circuit for connection to a network according to claim 5 wherein said two reference are supplied by a single reference path of said reference circuit which comprises a series connected first resistor (51) receiving power from the upper level power supply (11) which is coupled to said second node (15), and from second node (15) said voltage reference path is connected to the gate and drain of a reference circuit nfet (52) device, and the source of said reference circuit nfet (52) device is connected to a tuned reference voltage node which is then connected to the source of a reference circuit pfet (53) device, and wherein the gate of the reference circuit pfet (53) device is tied to its drain and both the source and gate of the reference circuit pfet (53) device are connected to the first node (14), and the first node (14) is connected to a second resistor (54) and the other end of said second resistor (54) is connected to the lower level power supply (12).

8. The terminator circuit for connection to a network according to claim 5 wherein said reference circuit has a reference circuit nfet and reference circuit pfet connect back to back gate to drain to track corresponding mirror devices of said terminator input devices to control each of their turn on voltages, so that no excessive through current in nfet (16) and pfet (17) will occur, and wherein, at this logic state, one of the mirror devices will be off and reduce the power requirements of the terminator network.

9. The terminator circuit for connection to a network according to claim 7 wherein the resistors are adjusted to adjust the swing voltage of the terminator.

10. The terminator circuit for connection to a network according to claim 7 wherein the resistors are adjusted to adjust the swing voltage of the terminator to that approximating an ideal 50 ohm split resistor terminator.

11. The terminator circuit according to claim 10 wherein parasitic diodes and a parasitic bipolar transistor in the pfet (17) and nfet (16) mirror devices are active even when the mirror devices are not powered to provide ESD (electrostatic discharge) protection during handing of the device.

* * * * *